(12) United States Patent
Azdasht et al.

(10) Patent No.: US 6,478,906 B1
(45) Date of Patent: Nov. 12, 2002

(54) METHOD FOR BONDING A FLEXIBLE SUBSTRATE TO A CHIP

(75) Inventors: Ghassem Azdasht, Berlin (DE); Elke Zakel, Falkensee (DE); Herbert Reichl, Berlin (DE)

(73) Assignee: Fraunhofer-Gesellschaft zur Forderung der angewandten Forschung e. V., Munich (DE)

( * ) Notice: Subject to any disclaimer, the term of this patent is extended or adjusted under 35 U.S.C. 154(b) by 4 days.

(21) Appl. No.: 09/693,255

(22) Filed: Oct. 20, 2000

Related U.S. Application Data

(62) Division of application No. 08/836,901, filed as application No. PCT/DE96/00228 on Feb. 14, 1996.

(30) Foreign Application Priority Data

Feb. 15, 1995 (DE) .......................................... 195 04 967

(51) Int. Cl.$^7$ .............................................. B32B 31/16

(52) U.S. Cl. .................... 156/73.1; 156/155; 228/110.1

(58) Field of Search ................................ 156/73.1, 155, 156/196, 297; 228/110.1

(56) References Cited

U.S. PATENT DOCUMENTS

| | | |
|---|---|---|
| 4,119,260 A | 10/1978 | Stöeckel |
| 4,906,812 A | 3/1990 | Nied et al. |
| 4,970,365 A | 11/1990 | Chalco |
| 4,978,385 A | 12/1990 | Luijtjes et al. |
| 5,055,652 A | 10/1991 | Jones et al. |
| 5,250,469 A | 10/1993 | Tanaka et al. |
| 5,341,979 A | 8/1994 | Gupta |
| 5,354,392 A * | 10/1994 | Santo et al. ............... 156/291 |
| 5,360,426 A | 11/1994 | Müller et al. |
| 5,847,356 A | 12/1998 | Santhanam |
| 6,323,058 B1 * | 11/2001 | Murakamz et al. ......... 257/712 |

FOREIGN PATENT DOCUMENTS

| | | |
|---|---|---|
| DE | 140942 | 4/1980 |
| DE | 42 00 49 R | 4/1993 |
| EP | 0292295 | 5/1988 |

OTHER PUBLICATIONS

Patent Abstracts of Japan, E–1139 May 9, 1991, vol. 15/No. 470.
Patent Abstracts of Japan, E–824 Sep. 27, 1989, vol. 13/No. 433.
Patent Abstracts of Japan, E–1420 Aug. 24, 1993, vol. 17/No. 463.
Patent Abstracts of Japan, E–1561 Jun. 14, 1994, vol. 18/No. 311.
Patent Abstracts of Japan, E–1465 Nov. 26, 1993, vol. 17/No. 640.
IBM Technical Disclosure Bulletin, vol. 31 No. 3, Aug., 1988.

* cited by examiner

Primary Examiner—Michael W. Ball
Assistant Examiner—John T. Haran
(74) Attorney, Agent, or Firm—Darby & Darby

(57) ABSTRACT

Method for thermally bonding contact elements (14, 15) of a flexible film substrate (10) to contact metallizations (17) of an electronic component (12), the flexible film substrate having a support layer (13) of transparent plastics material and energy being applied to the contact elements from their rear by means of laser radiation (11), the transparency of the support layer (13), the absorption of the contact elements (14, 15) and the wavelength of the laser radiation (11) being matched to one another in such a way that the laser radiation is essentially transmitted through the support layer (13) and absorbed in the contact elements (14, 15), and the pressure being applied to the substrate (10) in such a way that the contact elements (14, 15) of the substrate (10) and the contact metallizations (17) of the component (12) are up against one another during the application of the laser radiation (11) in the region of an application point of the optical fibre.

2 Claims, 2 Drawing Sheets

METHOD FOR BONDING A FLEXIBLE SUBSTRATE TO A CHIP

This is a division, of application Ser. No. 08/836,901, filed Jun. 23 1997 which is a 371 of PCT/DE/96/00228 filed Feb. 13, 1996. Each of these prior applications is hereby incorporated herein by reference, in its entirety.

BACKGROUND OF THE INVENTION

The present invention relates to a method for thermally bonding contact elements of a flexible film substrate to contact metallizations of an electronic component.

To bond flexible film substrates to an electronic component, for example a chip, use has hitherto normally been made of the thermocompression method, in which a so-called thermode is pressed against contact elements of the substrate with the application of pressure and temperature in order to bond said contact elements to contact metallizations of the chip. In order to prevent damage in this process to the temperature-sensitive plastics-material support layer of the substrate, which layer generally has a decomposition temperature which is in the range of the temperature necessary for the bond, it is necessary in the case of the known method to remove the support layer and, possibly, an adhesive layer bonding the support layer to the contact elements prior to the application of pressure and temperature to the contact elements so that a direct access to the contact elements of the substrate from their rear is possible. The removal of the support layer proves in practice to be very complicated, generally, apertures referred to as "windows" are etched in the support layer of the substrate for this purpose in a separate method. Substrates prepared in this way can then be used by means of a bonding procedure, referred to as "inner-lead bonding", within the framework of an automated bonding method referred to as "tape automated bonding".

By way of example, reference is made to U.S. Pat. No. 4,970,365 for the current state of development of methods for thermally bonding contact elements of a flexible film substrate to contact elements of an electronic component. This publication discloses a method in which laser radiation is applied to the contact elements of a polyimide film substrate for the purpose of bonding to contact metallizations of a component at the rear. In this process, the application to the exposed contact elements takes place remotely from the thin polyimide support layer of the film substrate.

SUMMARY OF THE INVENTION

The object of the present invention is to propose a method which makes possible bonding of the contact elements of flexible film substrates to the contact metallizations of electronic components possible without the need to expose the contact elements in a preceding method.

According to a first solution, the application of laser radiation to the contact elements via an optical fibre is provided in the method according to the invention, a transparent support layer or the absorption of the contact elements being used to transmit the radiation with a laser radiation wavelength approximately match thereto essentially through the support layer and to absorb it in the contact elements. Furthermore, an application of pressure is superimposed, according to the invention, on the application of laser radiation, in such a way that, during the application of laser radiation, the contact elements of the substrate and the contact metallization of the component in the region of an application point of the optical fibre are pressed against one another and temperature is applied by means of the laser radiation. Such components may, for example, be chips, but also generally substrates provided with connecting areas. Two film substrates can also be bonded to one another in the method according to the invention.

This application of pressure prevents the formation of air gaps between the contact elements and the contact metallizations, a reliable thermocoupling thereby being provided between the latter. An inadequate thermocoupling could result in a heat build-up in the region of the contact elements, which would, in turn, result in an undesirable load of temperature on the substrate or on the support layer and, possibly, on an adhesive layer bonding the support layer to the contact elements.

As a result of using radiation energy for applying temperature to the contact elements, the good transparency properties provided in the normal case, for example, with a plastics-material support layer formed from polyimide are utilized to generate the temperature necessary for the thermal bonding only in the bonding region as a result of the good absorption properties of the metallic contact elements.

The use of radiation energy for applying temperature to contact elements for the purpose of thermally bonding the contact elements of a transparent substrate to the contact metallizations of a semiconductor is in principle also disclosed in DD 140 942. The substrate disclosed in DD 140 942 has, however, a relatively thick, rigid substrate body which, because of its material properties, is suitable for transferring the contact pressure, applied via a clamping device, necessary for producing the thermal bond between the contact elements and the contact metallizations. In addition, in the known method for introducing the radiation energy into the contact elements, a complicated optical device is necessary which makes it possible to focus the radiation energy with respect to the position of the contact elements.

In contrast to the substrate material disclosed in DD 140 942, the substrate to which the method according to the invention is applied is a flexible film substrate which can be loaded to a substantially lesser extent both thermally and mechanically just because of its relatively small thickness. In this regard, the method according to the invention has the advantage that a discrete or punctiform exposure of the film substrate in the region of the application point of the optical fibre is provided both in regard to the necessary contact pressure and in regard to the temperature necessary for producing the bond. In addition, complicated focusing optics can be dispensed with in this connection, which substantially simplifies the construction of the equipment necessary for carrying out the method compared with the method disclosed in DD 140 942.

The discrete exposure of a contact point of two contact elements to be bonded by means of an optical fibre which serves to introduce both the pressure and the energy necessary for bonding is indeed disclosed in DE 42 00 492 A1. However, in this known method, the optical fibre is in direct contact with one of the two contact elements to be bonded.

If the fibre end surface of the optical fibre is pressed directly against the support layer of the substrate for the purpose of applying pressure, it is possible to carry out the method with a minimum device complexity.

In addition, there is also the possibility of applying energy by means of an optical fibre or light-guide optics and to use a separate, and therefore independent thereof, contact-pressure device to apply pressure. As a result, it is possible to adapt the design of the contact-pressure device to the actual dimensions of the substrate or of the component which exist in a particular case.

One way of applying pressure is to generate reduced pressure in a contact region between the substrate and the component.

In accordance with a second solution, the substrate is bonded to the component in two phases. According to the invention, ultrasonically inducated mechanical vibrations and pressure are applied, in a first phase, to the support layer in such a way that a support-layer region covering a contact region of a contact element is exposed. In a subsequent second phase, pressure and temperature and/or ultrasonically induced mechanical vibrations are then applied to the contact element which has now been exposed on the rear in the connection region for the purpose of bonding to the associated contact metallization.

This second bonding method according to the invention, which is an alternative to the first method according to the invention, makes also possible a contact between a substrate and a component without a pretreatment, carried out separately from the bonding operation and independently of the latter, of the substrate in a separate method. On the contrary, in accordance with the second solution according to the invention, the first phase, which serves as preparation for the actual contacting, and the second phase, the actual contacting phase, are combined with one another in one operation. In this case, there is chosen for the "exposure" of the contact elements in the contact region an application of energy which is essentially characterized by ultrasonically induced vibrations and pressure, that is to say forms of energy which prove to be harmless for the plastics-material support layer since they operate only discretely and do not result in a large-area decomposition of the support layer or in delamination between the contact elements and the support layer as does an application of temperature to the support layer. In the case of this second alternative method according to the invention, the temperature necessary to produce the thermal bond is applied, in accordance with the first alternative method according to the invention, only in the bonding region between the contact elements of the substrate and the contact metallizations of the component.

The abovementioned alternative method according to the invention proves particularly advantageous if the energy is applied by means of a pin-like thermode which is used, during the first phase, to apply ultrasound to the support layer and, during the second phase, to apply temperature and/or ultrasound to the contact element. As a result it is consequently possible to carry out both phases with one and the same tool so that the method proves particularly simple in implementation and also only a correspondingly simply designed device is necessary to carry it out.

In accordance with a further achievement, the substrate is again bonded to the component in two phases, but with the different that, during the first phase, the contact element is not exposed, but ultrasonically induced mechanical vibrations and pressure are applied to the support layer in such a way that a support-layer region covering a contact region of one contact element is compressed and then serves, in a second phase, to transmit the ultrasonically induced mechanical vibrations to the contact element. In this case, use is made of the effect that a support layer, which per se transmits ultrasonic vibrations only inadequately because of its flexibility, become relatively rigid in the state of extreme compression and, consequently, becomes a good conductor of vibrations.

BRIEF DESCRIPTION OF THE DRAWING FIGURES

The two alternative methods according to the invention are explained in greater detail below by reference to the drawings. In the drawings.

DETAILED DESCRIPTION OF THE INVENTION

Figure 1:
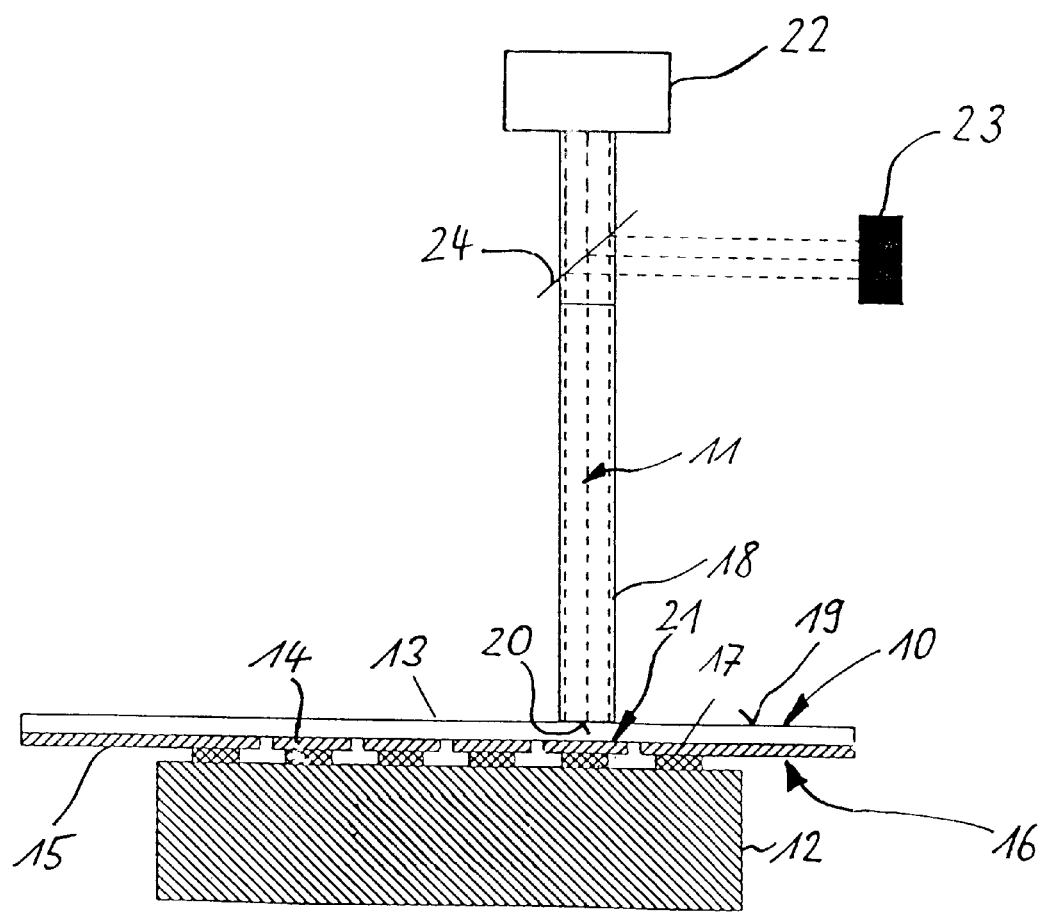
FIG. 1 shows a bonding method using laser radiation.

FIG. 1 shows a variant of the first alternative method according to the invention in which laser radiation 11 is applied to a substrate 10 for the purpose of bonding to a chip 12.

The substrate 10 has a polyimide support layer 13 which is provided with a metallization 16 which has been applied, in this exemplary embodiment of the substrate 10, for example, by sputtering, in order to form contact elements 14, 15.

On its upper side adjacent to the contact elements 14, 15 of the substrate 10, the chip 12 has raised contact metallizations 17, which are usually described as bumps and which are used for bonding to the contact elements 14, 15.

The contact elements 14, 15 of the substrate 10 are essentially composed of copper provided with a thin surface coating of gold. The contact metallizations 17 of the chip are composed, in this exemplary embodiment, of a gold/tin alloy (Au/Sn 80/20 having a melting point of about 280° C.).

The bonding procedure shown in FIG. 1 and explained below is equally applicable to the tape automated bonding method and to the flip-chip method.

An optical fibre 18 whose fibre end face 20 is applied to the rear 19, opposite the contact elements 14, 15, of the support layer 13 is used to apply laser radiation 11 to the substrate 10 in the exemplary embodiment shown in FIG. 1. In this connection, the application point is chosen so that a connection region 21 of the contact element 14 is covered. It is generally true that the substrate 10 and the chip 12 are positioned with respect to one another so that the individual connection regions 21 of the contact elements 14 and 15, respectively, are associated with the respective contact metallizations 17 of the chip 12. The individual contact elements 14, 15 can be bonded to the associated contact metallizations 17 by the so-called "single-point-bonding" method, in which the bonds between the individual pairs of contact elements 14 and 15, respectively, and contact metallizations 17 are made consecutively.

To make a thermal bond between a contact element 14 and an associated contact metallization 17, the substrate 10 is pressed against the chip 12 by the fibre end face 20 of the optical fibre 18 so that the contact element 14 and the contact metallization 17 are in contact with one another without a gap. Laser radiation 11 is applied to the substrate 10 by means of a laser source 22 which is coupled to the optical fibre 18 and for which an Nd:YAG laser, which emits a laser radiation having a wavelength of 1065 nm, is particularly suitable in the case of the combination, specified above, of the material for the support layer 13 and the material for the contact element 14. The polyimide support layer 13 has a transmission of 88% relative to this wavelength. A substantial proportion of the radiation not transmitted is reflected so that only a comparatively small proportion of radiation is absorbed. The laser radiation 11 is absorbed essentially in the contact element 14 which is formed from copper and which heats up correspondingly. The laser energy, converted into thermal energy, is conducted in an essentially loss-free manner into the contact metallization 17 via the gap-free coupling, described above, of the contact element 14 to the contact metallization 17 so that the latter heats up to the necessary melting point.

To prevent overheating in the bonding region between the contact element 14 and the contact metallization 17 with the formation of a corresponding heat build-up, it is advantageous, particularly in the case where the power of the laser source used is still not 100% matched to the mutually combined materials of the substrate, the contact elements and the contact metallizations 17, if the bonding temperature achieved in the bonding region, particularly the temperature resulting therefrom in the support layer 13, is monitored by a temperature control signal not shown here in greater detail. This can be done, for example, with the aid of an infrared detector 23 which picks up the infrared radiation reflected by the support layer 13 and the fibre end face 20, deflected via a prism 24 and transmits it as a corresponding control signal to a temperature control device not shown here in greater detail.

Figure 2:
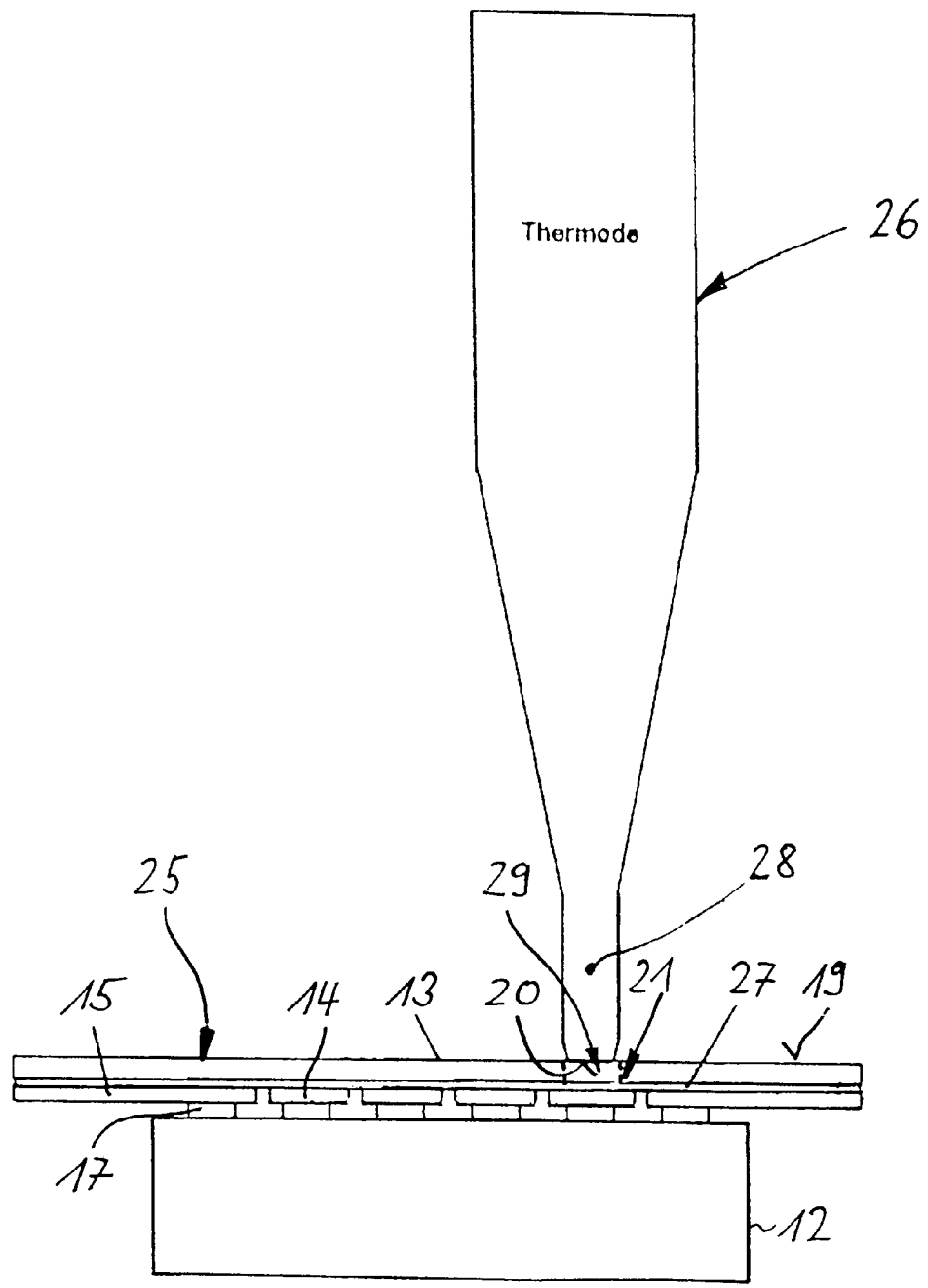
FIG. 2 shows a bonding method using application of combined ultrasonic and thermal energy.

FIG. 2 explains a variant of a further alternative method according to the invention, in which the energy is applied to a substrate 25 by means of a thermode 26.

The substrate 25 differs from the substrate 10 in that the contact elements 14, 15 are not applied directly to the support layer 13, but an adhesive layer 27 for bonding the contact layers 14, 15 to the support layer 13 is provided in between. In the case of a substrate formed in this way, the contact elements can be formed from a copper foil laminated onto the support layer. It is emphasized that the design of the substrate 10 or 25 has no essential effect on the applicability of the method shown in FIG. 1 and in FIG. 2. On the contrary, the substrates 10 or 25, shown here by way of example, could also be mutually interchanged.

In the variant of the method shown in FIG. 2, the thermode 26 with its pin-like thermode head 28, which roughly corresponds in diameter to the optical fibre 18 shown in FIG. 1, is moved up against the rear 19 of the support layer 13. In a first phase of the bonding operation, the thermode head 28 is moved towards the connection region 21 of the contact element 14. For this purpose, the support layer 13 and the adhesive layer 27 in the support-layer region 29 are removed essentially by ultrasonically induced mechanical microvibrations of the thermode 26 or of the thermode head 28 with simultaneous application of pressure or a forward movement. Only when the thermode head 28 is up against the rear of the contact element 14 in the connection region 21 is sufficient energy applied by the thermode 26 in the second phase to melt the contact metallization 17, the thermode 26 simultaneously being pressed against the contact element 14 to ensure a good thermocoupling.

The type of energy applied is essentially determined by the materials of the contact elements or of the contact metallizations to be bonded to one another. In the case of a gold/gold contact, for example, ultrasound, temperature and increased pressure with respect to the first phase are applied in the second phase to bond the materials to one another by pressure welding. In the case of a gold/tin contact, it is advantageous to apply temperature and a low pressure compared with the previous example for the second phase in order to bond the materials together in a soldering operation.

The temperature necessary to melt the contact metallization 17 and to bond the contact metallization 17 to the contact element 14 is about 400° C. This temperature is in the region of the decomposition temperature of polyimide (about 400° C.) so that it becomes clear that direct application to the support layer 13, that is to say without prior removal of the support-layer region 29, would result in damage to the support layer 13.

What is claimed is:

1. Method for thermally bonding contact elements of a flexible substrate to contact metallizations of an electronic component, the flexible substrate having a plastics-material support layer and energy being applied to the contact elements from their rear, characterized in that, in a first phase, ultrasonically induced mechanical vibrations and pressure are applied to the support layer (13) in such a way that a support-layer region (29) covering a connection region (21) of a contact element (14, 15) is removed and, in a second phase, pressure and temperature and/or ultrasonically induced mechanical vibrations are applied to the contact element (14, 15) for the purpose of bonding to the associated contact metallization (17).

2. Method according to claim 1, characterized in that the energy is applied by means of a pin-like thermode (26), the thermode (26) being used during the first phase to apply ultrasound to the support layer (13) and, during the second phase, to apply temperature and/or ultrasound to the contact element (14, 15).

* * * * *